United States Patent [19]
Nishigoori et al.

[11] Patent Number: 5,293,512
[45] Date of Patent: Mar. 8, 1994

[54] SEMICONDUCTOR DEVICE HAVING A GROOVE TYPE ISOLATION REGION

[75] Inventors: Tadashi Nishigoori; Takaaki Kuwata, both of Tokyo, Japan

[73] Assignee: NEC Corporation, Tokyo, Japan

[21] Appl. No.: 834,829

[22] Filed: Feb. 13, 1992

[30] Foreign Application Priority Data

Feb. 13, 1991 [JP] Japan .................................. 3-19611
Apr. 4, 1991 [JP] Japan .................................. 3-71349

[51] Int. Cl.⁵ ...................... H01L 27/02; H01L 29/06
[52] U.S. Cl. ................................... 257/622; 257/408; 257/412; 257/618
[58] Field of Search ...................... 357/55, 59 G, 59 I; 257/408, 412, 618, 621, 622

[56] References Cited

U.S. PATENT DOCUMENTS

| | | | |
|---|---|---|---|
| 4,538,344 | 9/1985 | Okumura et al. | 29/589 |
| 4,967,259 | 10/1990 | Takagi | 357/68 |
| 5,032,882 | 7/1991 | Okumura et al. | 357/23.6 |
| 5,079,602 | 1/1992 | Harada | 357/23.4 |
| 5,175,606 | 12/1992 | Tsai et al. | 257/320 |

FOREIGN PATENT DOCUMENTS

| | | | |
|---|---|---|---|
| 60-130163 | 7/1985 | Japan | 357/55 |
| 1-140756 | 6/1989 | Japan | 357/55 |

*Primary Examiner*—Andrew J. James
*Assistant Examiner*—Valencia M. Wallace
*Attorney, Agent, or Firm*—Burns, Doane, Swecker & Mathis

[57] ABSTRACT

A semiconductor device is disclosed in which a groove type element isolation region in the surroundings of a first diffused layer of one conductivity type formed on the surface of a silicon substrate of the opposite conductivity type, an insulating film is embedded in the groove type element isolation region, and an interlayer insulating film is provided on the silicon substrate. A contact hole for connecting the first diffused layer to a metallic wiring is provided at a position that straddles the boundary between the first diffused layer and the groove type element isolation region, the insulating film embedded in the groove type element isolation region is exposed in a part of the bottom face of the contact hole, and the silicon substrate including the first diffused layer is exposed on the side face of the contact hole. On the surface of the silicon substrate exposed to the contact hole there is formed a second diffused layer of the one conductivity type, and this diffused layer is connected to the first diffused layer. Because of the structure as described in the above, the increase in the contact resistance between the first and the second diffused layer, and the metallic wiring can be suppressed even if the aperture of the contact hole is decreased. Moreover, it becomes unnecessary to provide a space between the contact hole and the groove type element isolation region so that it becomes possible to reduce the area of the first diffused layer, and it is effective to enhance the operating speed due to the increase in the integration of the semiconductor device and to the decrease in the junction capacitance.

6 Claims, 9 Drawing Sheets

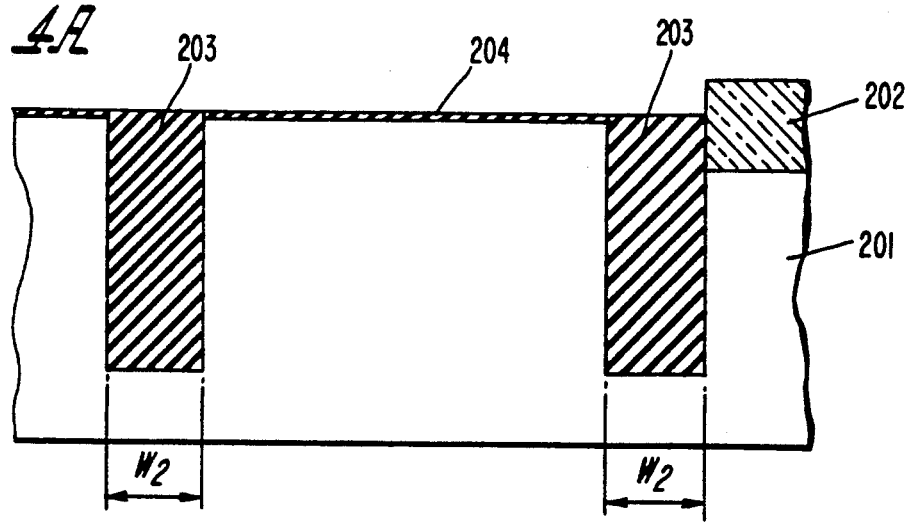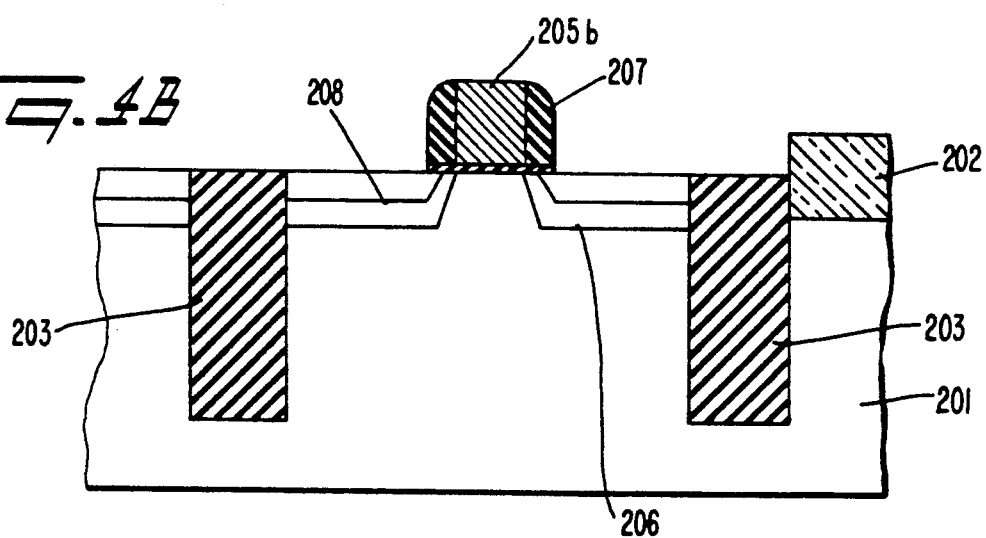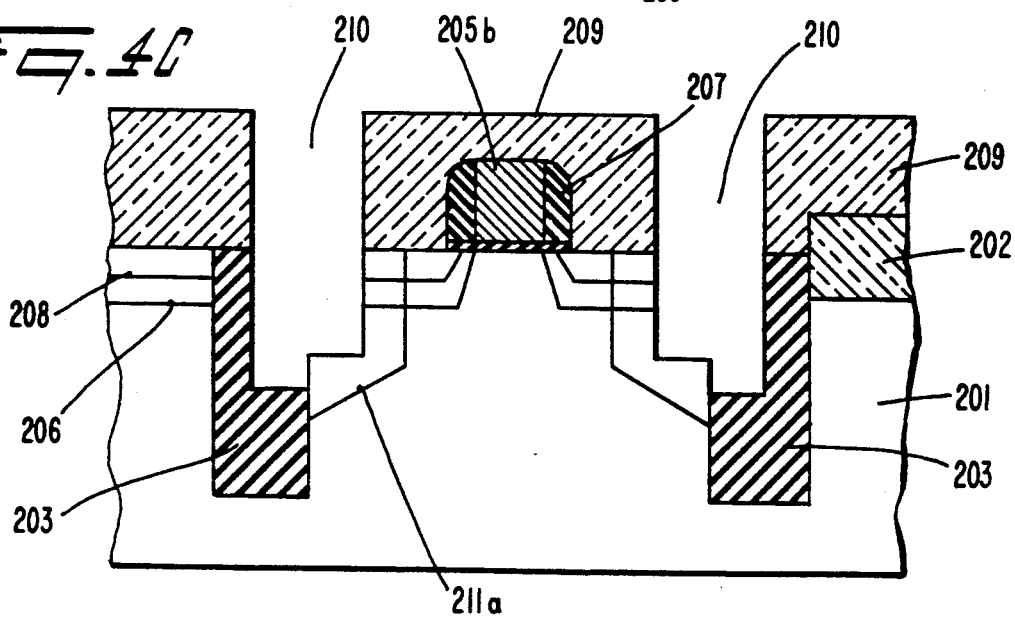

SEMICONDUCTOR DEVICE HAVING A GROOVE TYPE ISOLATION REGION

BACKGROUND OF THE INVENTION

1. Field of the Invention

The present invention relates to a semiconductor device, and more particularly, to the structure of a contact hole that connects a diffused layer and a metallic wiring in a semiconductor device having at least a groove type element isolation region.

2. Description of the Prior Art

In semiconductor devices that include MOS transistors, fine patterning is in progress for the purpose of enhancing the integration and operating speed of the semiconductor devices. For example, in a MOS transistor, fine patterning is being realized by the reduction of the gate length of the gate electrode, the reduction of the area of the diffused layer forming the source and drain region, the reduction of the width of the element isolation region between the MOS transistors, and the like. A reduction in the gate length lowers the on-resistance of the MOS transistor, and improves the current driving power of the MOS transistor. By so doing, it becomes possible to reduce the gate width, and to reduce the area of the diffused layer forming the source and drain region. The reduction of the area of the diffused layer is accompanied by a decrease in the junction capacity, and the fine patterning contributes to the enhancement of the operating speed as viewed also from this point.

However, accompanying the reduction in the area of the diffusion layer forming the source and drain region, the aperture of the contact hole that connects the diffused layer and a metallic wiring is also necessarily reduced, and an aperture smaller than 1 μm square has become to be required. A similar situation also exists as to other diffused layers (diffused layers used for the wiring, the resistor element, and the like) other than the diffused layer forming the source and drain region. In addition, the reduction in the opening area of the contact hole leads to an increase in the contact resistance between the diffused layer and the metallic wiring. In the diffused layer forming the source and drain region, the increase of the contact resistance becomes a factor in obstructing the improvement of the current driving power of the MOS transistor. In particular, the effect is dominant in a MOS transistor which adapts the sub-micron design rules. Under these circumstances, there has been disclosed a method for copying with the increase of the contact resistance in Japanese Patent Application Laid Open No. 2-312 (Jan. 5, 1990).

The result of application of the method disclosed in the above-mentioned publication to the formation of a MOS transistor is as in the following. Namely, a gate oxide film and a gate electrode are formed on the surface of a silicon substrate of one conductivity type, a first diffused layer of the opposite conductivity type self-aligned to the gate electrode is formed, and an interlayer insulating film is formed all over the surface. Next, the interlayer insulating film and the diffused layer of the opposite conductivity type are sequentially etched using a photoresist film as the mask to form a contact hole (referred to as a groove type contact hole hereinafter) that penetrates the first diffused layer. After removal of the photoresist film an organic solvent including impurities for diffusion of the opposite conductivity type is applied all over the surface, and by subjecting the system to a heat treatment, a second diffused layer of the opposite conductivity type is formed on the surface of the silicon substrate (including a part of the first diffused layer) that is exposed to the groove type contact hole. The second diffused layer is connected to the first diffused layer. After removal of the organic solvent, a metallic wiring is formed. According to the method, the reduction in the contact area between the metallic wiring and the diffused layer can be avoided even when the aperture of the groove type contact hole is reduced, so that the increase in the contact resistance between the diffused layer and the metallic wiring can be suppressed.

In the aforementioned publication, no description is found as to the element isolation region of the semiconductor device and the positional relationship between the element isolation region and the groove type contact hole. In the element isolation region of a semiconductor device that includes a MOS transistor, accompanying the fine patterning of the semiconductor device, combined use of a groove type element isolation region and a LOCOS type field oxide film is being adopted. In that case, a groove type element isolation region surrounding the periphery of the semiconductor device such as MOS transistor is formed. As to the positional relation (space between the two) between the element insulation region and the groove type contact hole, it is generally necessary to have a space between the element isolation region and the groove type contact hole which is greater than the value of the mask alignment margin of a photoresist film for the formation of the groove type contact hole. The reason for this is to avoid the etching of the element isolation region at the time of formation of the groove type contact hole.

The method in the above-mentioned publication will be considered for the case of an N-channel MOS transistor in which a LOCOS type field oxide film is adopted as the element isolation region as an example. In forming a semiconductor device consisting of an N-channel MOS transistor according to the quarter-micron design rules, first, a LOCOS type field oxide film with thickness of about 0.3 μm and a gate oxide film with thickness of about 7–10 nm are formed on the surface of a silicon substrate with a P-type impurity concentration of $(2 \text{ to } 3) \times 10^{17}$ cm$^{-3}$. The smallest width of the field oxide film is 0.35 μm. Next, a gate electrode with thickness of about 0.3 μm and gate length of 0.25 μm is formed. This gate electrode is formed of a polycrystalline silicon film or a polycide film. An N$^-$-type diffused layer with junction depth of about 0.2 μm is formed in self-alignment with the gate electrode. Next, a spacer with thickness of about 0.1 μm consisting of a silicon oxide film is formed on the side faces of the gate electrode. An N$^+$-type diffused layer with junction depth of about 0.1 μm is formed in self-alignment with the spacers. In this case, a first diffused layer is constituted of the N$^-$-type diffused layer and the N$^+$-type diffused layer. Next, an interlayer insulating film consisting of a BPSG film with thickness of about 0.5 μm is formed all over the surface. Then, a groove type contact hole with opening area of 0.4 μm square which penetrates the N$^-$-type diffused layer is formed by anisotropic etching by CF$_4$ that uses a photoresist film as the mask. The mask alignment margin at this time is ±0.1 μm. The height of the surface of the silicon substrate (N$^+$-type diffused layer) from the bottom face of the groove type contact hole is about 0.25 μm. Next, an N$^+$-type diffused layer with junction depth of about 0.15 μm which forms a second diffused layer is formed by means of the tilted rotation ion implantation method that uses arsenic or phosphorus on the surface of the silicon substrate (including a part of the N+-type and N−-type diffused layers that form the first diffused layer). Next, an N+-type polycrystalline silicon film or a tungsten film is embedded in the groove type contact hole, and a metallic wiring consisting of an aluminum alloy film is formed.

In this N-channel MOS transistor, there is required a space of about 0.4 μm ("junction depth of the second diffused layer"+"increase in the depletion layer of the second diffused layer") between the gate electrode and the groove type contact hole because of the increase of about 0.25 μm in the depletion layer of the second diffused layer to which is applied a power supply voltage. The reason for this is to prevent the fluctuation in the current driving power of the MOS transistor due to the presence of the second diffused layer. Similarly, when the width of the field oxide film is equal to the minimum allowable width, a space of about 0.4 μm is required between the field oxide film and the groove type contact hole. The presence of this space is detrimental to the fine patterning of the semiconductor device. Moreover, the presence of this space brings about an increase in the junction capacitance of the diffused layer leading to an increase of the junction capacitance that exceeds the cancelation of the increase in the stray capacitance due to decrease in the contact resistance, which is an obstacle to the enhancement of the operating speed of the semiconductor device.

When the method disclosed in the aforementioned publication is applied to a semiconductor device that uses both of a groove type element isolation region and a LOCOS type field oxide film as an element isolation region, a groove type element isolation region is formed around the element isolation region, in the example of an N-channel MOS transistor. In this case, the space between the groove type contact hole and the gate electrode has the same value as in the above. When the height from the bottom face of the groove type element isolation region to the top face of the first diffused layer is smaller than the height from the bottom face of the second diffused layer to the top face of the first diffused layer, a space of about 0.4 μm is required between the groove type contact hole and the groove type element isolation region, analogous to the case of the LOCOS type field oxide film described in the above. When the height from the bottom face of the groove type element isolation region to the top face of the first diffused layer is greater than the height from the bottom face of the second diffused layer to the top face of the first diffused layer, the space between the groove type contact hole and the groove type element isolation region requires a value (0.15 μm, for example) greater than 0.1 μm which is the mask alignment margin. Because of this, it becomes possible to give fine geometry to, and to prevent the increase in the junction capacitance of, the semiconductor device, but fine patterning beyond that is not feasible. The situation is analogous for the diffused layers other than the diffused layer forming the source and drain region.

BRIEF SUMMARY OF THE INVENTION

Objects of the Invention

It is an object of the invention to provide a semiconductor device suitable for fine patterning.

It is an object of the invention to provide a semiconductor device which is suitable for fine patterning and is suitable for enhancing the operating speed.

It is an object of the invention to provide a contact hole for a semiconductor device which has a small aperture and is capable of suppressing the increase in the contact resistance between a diffused layer and a metallic wiring.

It is an object of the invention to provide a contact hole for a semiconductor device which has a small opening diameter and is capable of suppressing the increase in the contact resistance between a diffused layer and a metallic wiring, and to provide a semiconductor device suitable for fine patterning.

It is an object of the invention to provide a contact hole for a semiconductor device which has a small aperture and is capable of suppressing the increase in the contact resistance between a diffused layer and a metallic wiring, and to provide a semiconductor device suitable for fine patterning and suitable for enhancing the operating speed.

It is an object of the invention to provide, in a semiconductor device that has at least a groove type element isolation region in the element isolation region, a contact hole for the semiconductor device which has a small aperture and is capable of suppressing the increase in the contact resistance between a diffused layer and a metallic wiring.

It is an object of the invention to provide, in a semiconductor device that has at least a groove type element isolation region in the element isolation region, a contact hole for the semiconductor device which has a small aperture and is capable of suppressing the increase in the contact resistance between a diffused layer and a metallic wiring, and to provide a semiconductor device suitable for fine patterning.

It is an object of the invention to provide, in a semiconductor device that has at least a groove type element isolation region in the element isolation region, a contact hole for the semiconductor device which has a small aperture and is capable of suppressing the increase in the contact resistance between a diffused layer and a metallic wiring, and to provide a semiconductor device suitable for fine patterning and suitable for enhancing the operating speed.

It is an object of the invention to provide, in a semiconductor device which includes at least a MOS transistor and has at least a groove type element isolation region in the element isolation region, a contact hole for the semiconductor device which has a small aperture and is capable of suppressing the increase in the contact resistance between a diffused layer and a metallic wiring.

It is an object of the invention to provide, in a semiconductor device which includes at least a MOS transistor and has at least a groove type element isolation region in the element isolation region, a contact hole for the semiconductor device which has a small aperture and is capable of suppressing the increase in the contact resistance between a diffused layer and a metallic wiring, and to provide a semiconductor device suitable for fine patterning.

It is an object of the invention to provide, in a semiconductor device which includes at least a MOS transistor and has at least a groove type element isolation region in the element isolation region, a contact hole for the semiconductor device which has a small aperture and is capable of suppressing the increase in the contact resistance between a diffused layer and a metallic wiring, and to provide a semiconductor device which is suitable for fine patterning and is suitable for enhancing the operating speed.

Summary of the Invention

In a semiconductor device which has a groove type element isolation region formed by embedding an insulating film on the surface of a silicon substrate of one conductivity type, a first diffused layer of the opposed conductivity type formed on the surface of the silicon substrate surrounded by the groove type element isolation region, and an interlayer insulating film formed on the silicon substrate, has a groove type contact hole having at least an exposed surface of the first diffused layer on its side face and connects the first diffused layer with an embedded conductor film and a metallic wiring, and has a second diffused layer of the opposite conductivity type on the surface of the silicon substrate that includes a first diffused layer exposed by the groove type contact hole, the semiconductor device according to the invention exposes the insulating film that is embedded in the groove type element isolation region in a part of the bottom face of the groove type contact hole, and the height from the bottom face of the second diffused layer to the top face of the first diffused layer is smaller than the height from the bottom face of the groove type element isolation region to the top face of the first diffused layer.

It is preferable that the silicon substrate at a position deeper than the bottom face of the first diffused layer, or the top face of the first diffused layer is exposed in the part other than the aforementioned one part in the bottom face of the groove type contact hole. It is preferable that when the groove type contact holes for the respective parts of the first diffused layer, in the two parts of the first diffused layer provided via the groove type element isolation region, approach with each other, the width of the groove type element isolation region in that part is greater than the width of the groove type element isolation region in other parts. It is preferable that the conductor film embedded in the groove type contact hole is constituted of a first conductor film that includes an impurity of the opposite conductivity type that covers the surface of the groove type contact hole and a second conductive film provided on the first conductor film. Further, it is preferable that the first conductive film is a polycrystalline silicon film or a silicide film of a high melting point metal.

In the semiconductor device according to the invention it becomes unnecessary to provide a space between the groove type contact hole and the groove type element isolation region, and the groove type contact hole is provided straddling the boundary between the first diffused layer and the groove type element isolation region. Because of this, occurrence of an unnecessary increase in the junction capacitance due to the setting of the second diffused layer can be avoided, the area of the first diffused layer can be reduced, and the contact resistance can be reduced. For these reasons, enhancement of the degree of integration as well as the speed of operation of the semiconductor device can be facilitated.

BRIEF DESCRIPTION OF THE DRAWINGS

The above-mentioned and other objects, features, and advantages of this invention will become more apparent by reference to the following detailed description of the invention taken in conjunction with the accompanying drawing, wherein:

FIGS. 4A to 4D are schematic sectional views arranged in the order of processes for describing the fabrication method of the first embodiment, for the part shown by the line 2—2 in FIG. 3A;

DETAILED DESCRIPTION OF PREFERRED EMBODIMENTS

Figure 1A:
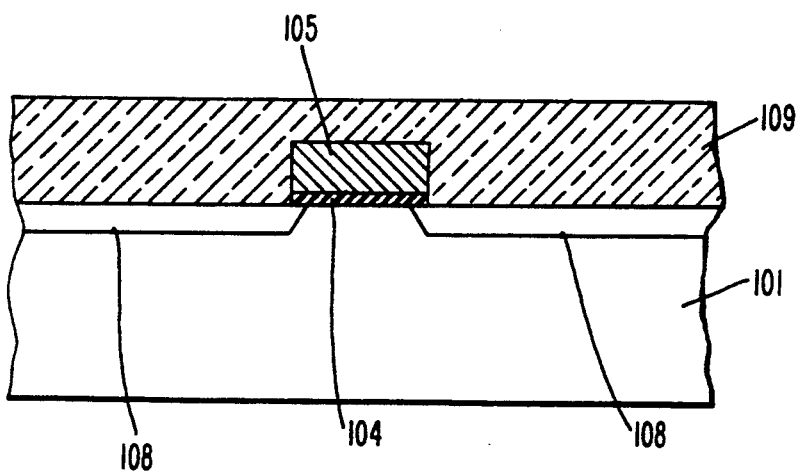
FIGS. 1A to 1C are schematic sectional views arranged in the order of processes for explaining the fabrication method of the prior art groove type contact hole.

Before proceeding to the description of this invention, by referring to the drawings, the structure of the conventional groove type contact hole will be described.

Figure 1B:
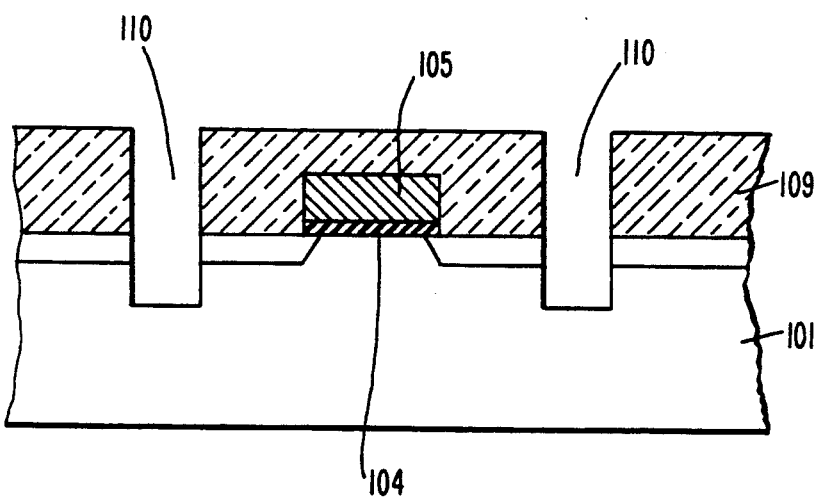
Figure 1C:
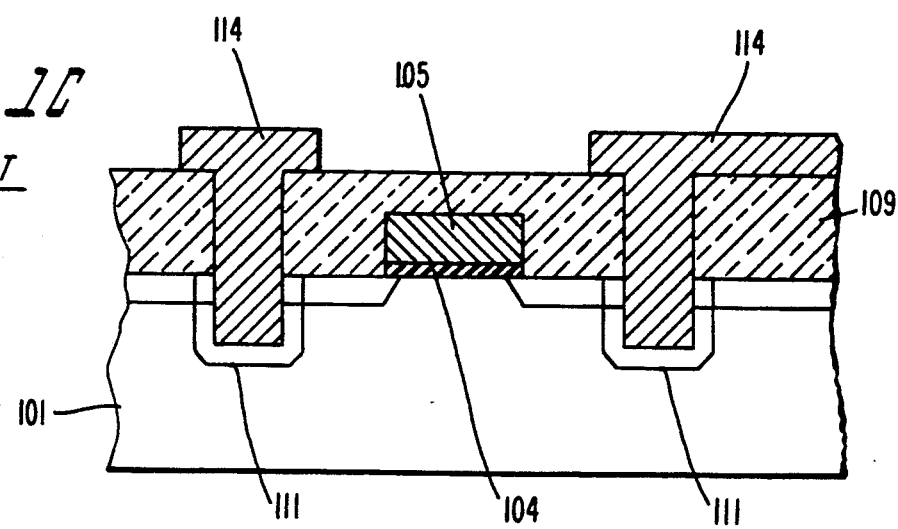

As a method for copying with the increase in the contact resistance due to reduction in the aperture of the contact hole for connecting a diffused layer and a metallic wiring accompanying the fine patterning of the semiconductor devices, there is a groove type contact hole as disclosed in the aforementioned Japanese Patent Application Laid Open No. 2-312. Referring to FIGS. 1A to 1C which are schematic sectional views arranged in the order of processes, the application of the method in the aforementioned publication to the formation of a MOS transistor will lead to the following. Namely, first, on the surface of a P-type silicon substrate 101, a gate oxide film 104 and a gate electrode 105 are formed, an N+-type diffused layer 108 which becomes a first diffused layer is formed in self-alignment to the gate electrode 105, and an interlayer insulating film 109 is formed allover the surface [FIG. 1A]. Next, the interlayer insulating film 109 and the diffused layer 108 are successively etched using a photoresist (not shown) as the mask, and a contact hole 110 which penetrates the diffused layer 108 [FIG. 1B] is formed. Such a contact hole is called hereinafter "groove type contact hole". After removal of the photoresist film an organic solvent (not shown) containing an N-type impurity for diffusion is applied all over the surface, and an N+-type diffused layer 111 which becomes a second diffused layer is formed on the surface of the silicon substrate 101 (including a part of the diffused layer 108) that is exposed by the groove type contact hole 110, by subjecting the system to a heat treatment. The diffused layer 111 thus formed is connected to the diffused layer 108. After removal of the organic solvent a metallic wiring 114 is formed. According to this method, reduction in the contact area between the metallic wiring and the diffused layer can be avoided even if the opening diameter of the groove type contact hole 110 is reduced, and the increase in the contact resistance between the diffused layer and the metallic wiring can be suppressed.

Figure 2A:
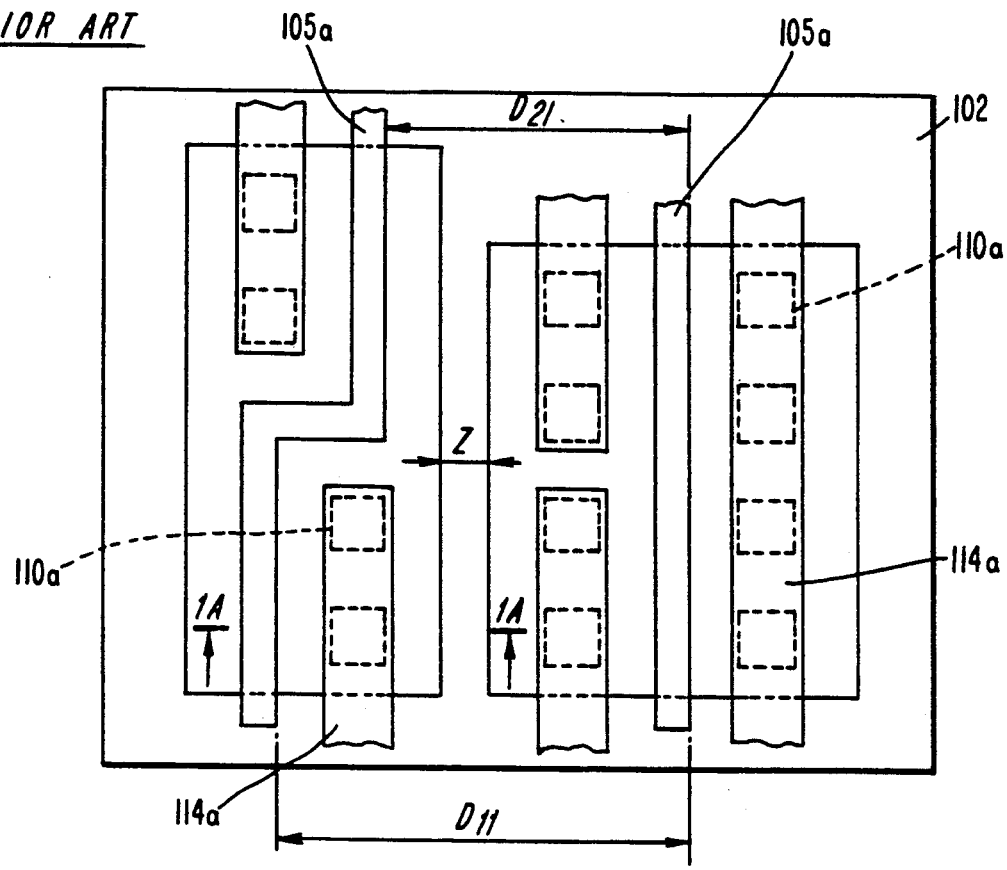
FIG. 2A is a schematic plan view for describing the problems that exist in a semiconductor device obtained by applying the quarter-micron design rule to the prior art groove type contact hole.
Figure 2B:
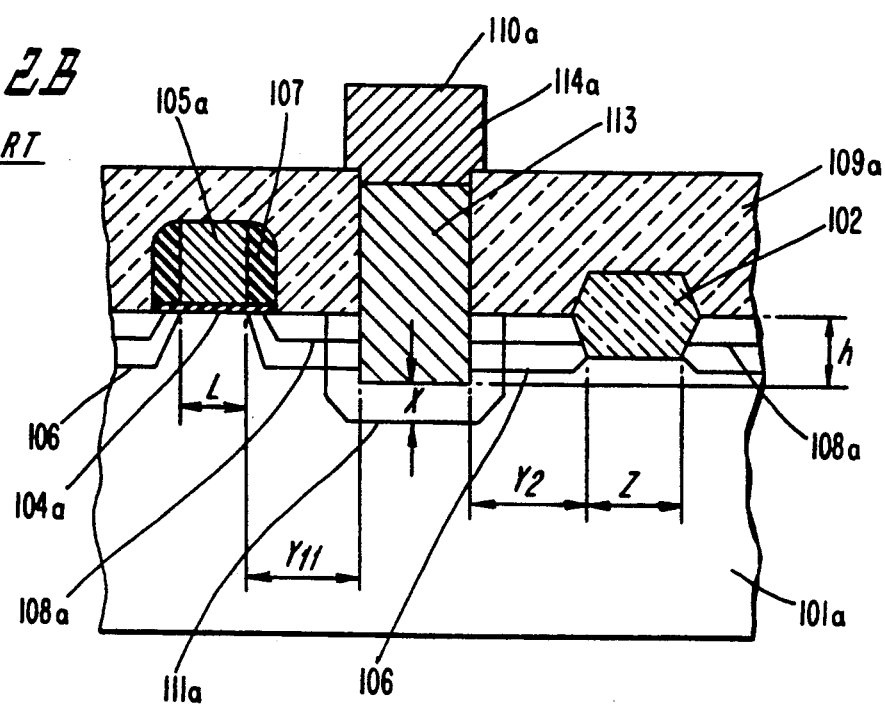
FIG. 2B is a schematic sectional view of the device in FIG. 2A along the line 1—1.

In the aforementioned publication there is found no reference to the element isolation region of the semiconductor device and the positional relationship between the element isolation region and the groove type contact hole. Referring to FIGS. 2A and 2B which are a schematic plan view and a schematic sectional view, respectively, of a semiconductor device consisting of an N-channel MOS transistor, the device has a LOCOS type field oxide film as the element isolation region. The formation of a semiconductor device, consisting of an N-channel MOS transistor, by employing the quarter-micron design rules proposed by the present inventors, according to the method in the aforementioned publication, will proceed as given below.

First, a LOCOS type field oxide film 102 with thickness of about 0.3 μm and a gate oxide film 104a with thickness of about 7 to 10 nm are formed on the surface of a P-type silicon substrate 101a with impurity concentration of $(2 \text{ to } 3) \times 10^{17} \text{ cm}^{-3}$. The minimum width (Z) of the field oxide film 102 is 0.35 μm. Next, gate electrodes 105a and 105b with thickness of about 0.3 μm and gate length of 0.25 μm are formed. These gate electrodes 105a and 105b are formed of a polycrystalline silicon film or a policide film. An N⁻-type diffused layer 106 with junction depth of about 0.2 μm is formed in self-alignment with the gate electrodes 105a and 105b. Next, a spacer 107 with width of about 0.1 μm consisting of a silicon oxide film is formed on the side faces of the gate electrodes 105a and 105b. Then, an N+-type diffused layer 108a with junction depth of about 0.1 μm is formed in self-alignment with the spacer 107. In the present case, a first diffused layer is constituted of the diffused layers 106 and 108a.

Next, an interlayer insulating film 109a consisting of a BPSG film with thickness of about 0.5 μm is formed all over the surface. Next, groove type contact holes 110a with aperture of 0.4 μm square penetrate the N⁻-type diffused layer by an anisotropic etching by CF₄ that uses a photoresist film as the mask. The mask alignment margin in this process is ±0.1 μm. The height (h) from the bottom face of the groove type contact hole 110a to the top face of the silicon substrate 101a (including N⁻-type diffused layer (106) is about 0.25 μm. Next, an N+-type diffused layer 111a with junction depth (X) of about 0.15 μm which forms a second diffused layer is formed on the surface of the silicon substrate 101a (including a part of the diffused layers 106 and 108a which form the first diffused layer) exposed by the groove type contact hole 110a is formed by the tilted rotation ion implantation method that uses arsenic or phosphorus. Next, a conductor film 113 consisting of an N+-type polycrystalline silicon film or a tungsten film is embedded inside the groove type contact hole 110a, and a metallic wiring 114a consisting of an aluminum alloy film is formed. At this time, the spaces ($D_{11}$ and $D_{21}$) between the center line of the gate electrode 105a and the center line of the gate electrode 105b are 3.0 μm and 2.2 μm.

In this N-channel MOS transistor, the space ($Y_{11}$) between the gate electrodes 105a or 105b and the groove type contact hole 110a is required to be about 0.4 μm (X + "increase in the depletion layer of the second diffused layer") because of an increase of about 0.25 μm in the depletion layer of the second diffused layer to which is applied a power supply voltage. The reason for this is to prevent the nonuniformity in the current driving power of the MOS transistor due to the presence of the second diffused layer. Analogously, when the width of the field oxide film 102 is Z, the space ($Y_2$) between the field oxide film 102 and the groove type contact hole 111a is required to be about 0.4 μm (namely, $Y_{11} = Y_2$). Now, the presence of $Y_2$ is a hindrance to the fine patterning of the semiconductor device. Moreover, the presence of $Y_2$ causes an increase in the junction capacitance of the diffused layer, and leads to an increase in the junction capacitance which exceeds the cancellation of the increase in the stray capacitance due to the decrease in the contact resistance, impeding the enhancement of the operating speed of the semiconductor device.

On the other hand, when the method in the aforementioned publication is applied to a semiconductor device which makes a simultaneous use of a groove type element isolation region and a LOCOS type field oxide film as an element isolation region, a groove type element isolation region is formed in the surroundings of the element isolation region, in the case of an N-channel MOS transistor. In this case the space between the groove type contact hole and the gate electrode has the same value as in the above. In case the bottom face of the groove type element isolation region is at smaller depth than the bottom face of the second diffused layer, a space of about 0.4 μm is required between the groove type contact hole and the groove type element isolation region, analogous to the case of the LOCOS type field oxide film in the above. In case the bottom face of the groove type element isolation region is at greater depth than the bottom face of the second diffused layer, a space with a value (for example, 0.15 μm) greater than 0.1 μm which is the mask alignment margin is required between the groove type contact hole and the groove type element isolation region. Therefore, there are obtained $D_{11} = 2.7$ μm and $D_{21} = 2.05$ μm. Because of this, it is possible to realize the fine patterning of the semiconductor device and to prevent the increase of the junction capacitance, compared with the case of the constitution of the element isolation region exclusively by means of a LOCOS type field oxide film. However, fine patterning beyond this is not possible.

Next, referring to the drawings, this invention will be described.

Figure 3A:
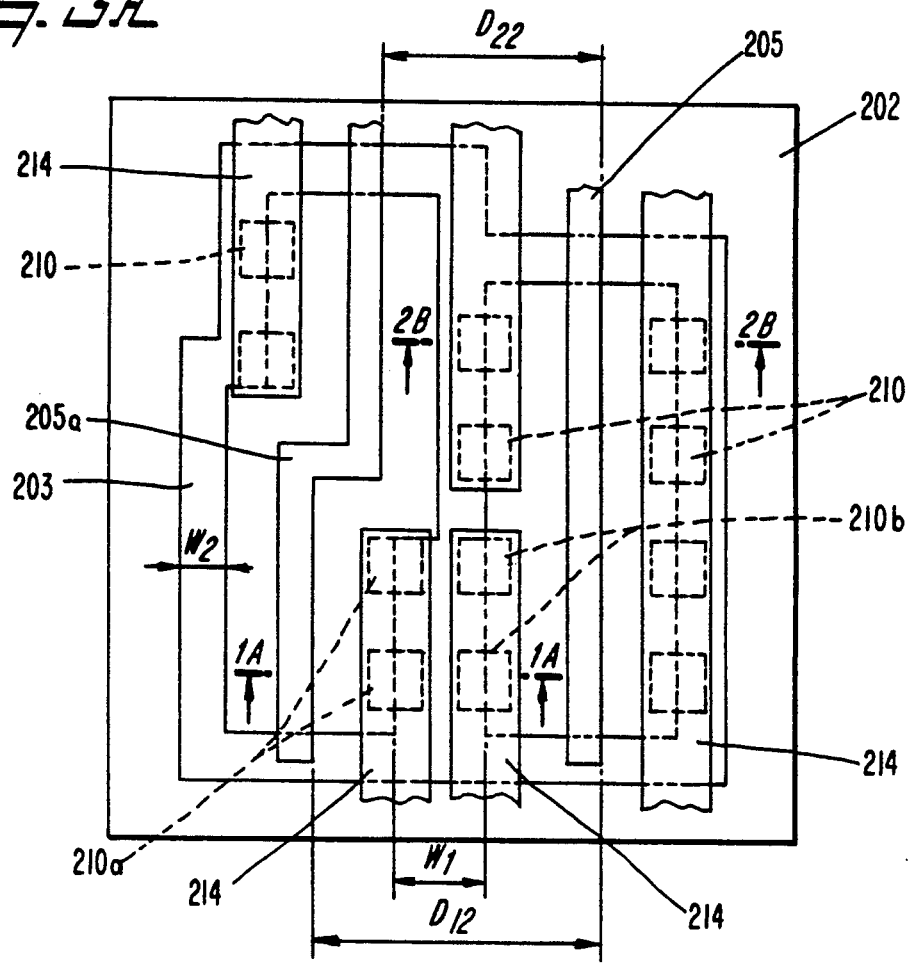
FIG. 3A is a schematic plan view for describing a first embodiment of the invention.
Figure 3B:
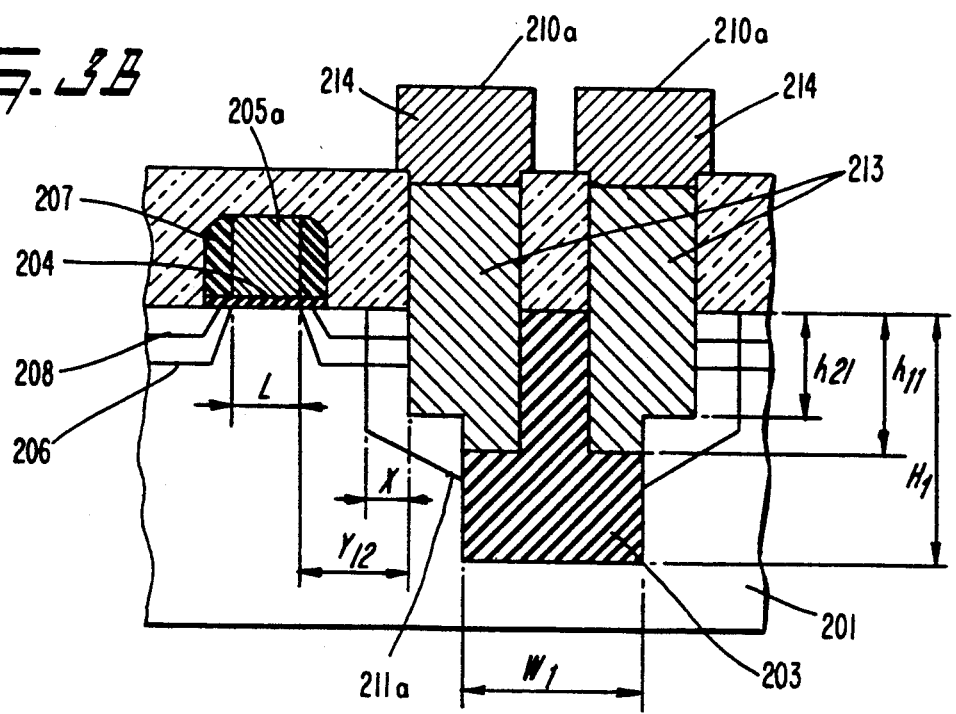
FIG. 3B is a schematic sectional view of the device in FIG. 3A along the line 1—1.
Figure 4D:
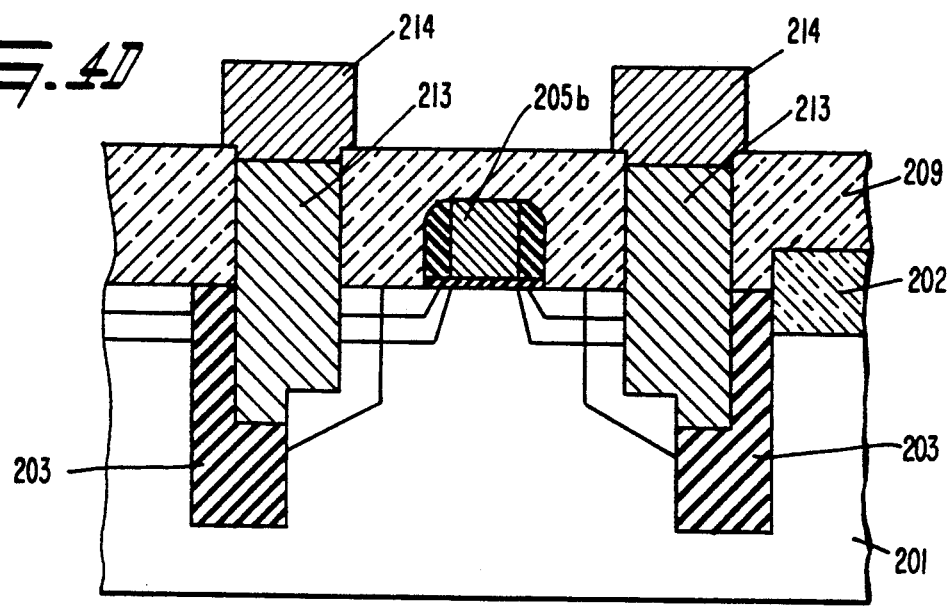

Referring to FIG. 3A which is a schematic plan view of the semiconductor device and to FIG. 3B which is the sectional view along the line 1—1 of the device in FIG. 3A, in the first embodiment of the invention, there is provided an element isolation region consisting of a LOCOS type field oxide film 202 with thickness of 0.3 μm and a groove type element isolation region 203 in which is embedded an insulating film on the surface of a P-type silicon substrate 201 with impurity concentration of $(2 \text{ to } 3) \times 10^{17} \text{ cm}^{-3}$. In the element formation region on the surface of the silicon substrate 201 surrounded by the groove type element isolation region 203, there is formed a gate oxide film 204 with thickness of about 7 to 10 nm, a gate electrode 205a and 205b with film thickness of about 3 μm and gate length of L (=0.25 μm), an N⁻-type diffused layer 206 having junction depth of about 0.2 μm formed in self-alignment with the gate electrode, spacers 207 consisting of a silicon oxide film with a width of about 0.1 μm formed on the side faces of the gate electrode, and two N-channel MOS transistors consisting of an N⁺-type diffused layer 208 having junction depth of about 0.1 μm formed in self-alignment with the spacers 207. In this embodiment, the first diffused layer is constituted of the N⁻-type diffused layer 206 and the N⁺-type diffused layer 208. On the element isolation region as well as on the element formation region there is formed an interlayer insulating film 209 with thickness of about 0.5 μm (the height of this film from the top face of the N⁺-type diffused layer 208) and with a flattened face. The interlayer insulating film 209 is constituted of a silicon oxide film or a BPSG film or a two-layer film formed by the upper layer of a BPSG film and the lower layer of a silicon oxide film. The height (the depth of the groove type element isolation region 203) of the top face of the silicon substrate (not shown in FIG. 3A) (the top face of the N⁺-type diffused layer 208) from the bottom face of the groove type element isolation region 203 is $H_1$, and the insulating film embedded in the groove type element isolation region 203 consists of a silicon oxide film or a BPSG film or a two-layer film formed by the upper layer of a BPSG film and the lower layer of a silicon oxide film. The gate electrodes 205a and 205b consist of a polycrystalline silicon film or a polycide film.

Groove type contact holes 210 and 210a are formed at positions with a distance $Y_{12}$ from the gate electrode 205a, and groove type contact holes 210 and 210b are formed at positions with a distance $Y_{12}$ from the gate electrode 205b. For the reason the same as for the case of the conventional N-channel MOS transistor there holds $Y_{12}=Y_{11}$ (=0.4 μm). The aperture of each of the groove type contact holes 210, 210a, and 210b is 0.4 μm square. These groove type contact holes 210, 210a, and 210b are respectively formed at positions that straddle the boundaries between the element formation region and the groove type element isolation region 203. Each of the bottom faces of the groove type contact holes 210, 210a, and 210b consists of two parts. One part of the bottom face of each of the groove type contact holes 210, 210a, and 210b is formed within the groove type element isolation region 203, the embedded insulating film of the groove type element isolation region 203 is exposed in this part of the bottom face, and the height (the depth of this bottom face from the top face of the silicon substrate 201) from this bottom face to the top face (or the top face of the N⁺-type diffused layer 208) is $h_{11}$. The other part of the bottom face of each of the groove type contact holes 210, 210a, and 210b is formed in the silicon substrate at a position deeper than the bottom face of the diffused layer 206, the silicon substrate 201 is exposed on this bottom face, and the height from this bottom face to the top face of the N⁺-type diffused layer 208 (the depth of this bottom face from the top face of the silicon substrate 201) is $h_{21}$. Here, the relation $h_{11} > h_{21} > 0.2$ μm (= the junction depth of the N⁻-type diffused layer 206).

In the part where the respective groove type contact hole 210a and the groove type contact hole 210b of the two N-channel MOS transistors, the width of the groove type element isolation region 203 is equal to $W_1$ (=0.65 μm). At this time, the space between the groove type contact hole 210a and the groove type contact hole 210b is equal to 0.25 μm. On the other hand, the width of the groove type element isolation region, in the part where the groove type contact is absent and in the part where the groove type contact holes 210 are present, is equal to the minimum width $W_2$ (=0.35 μm). In this case, the space between the groove type contact hole 210 and the N⁺-type diffused layer 208 of the adjacent transistor (the portion in between is constituted of the groove type element isolation region 203) is 0.15 μm. It is to be noted that the value for $W_1$ and $W_2$ varies depending upon the limitations from the mask design and the processes, in order to avoid the influence of the depletion layer of the second diffused layer that will be described later.

On the surface of the silicon substrate 201 exposed to the bottom face and side face of each of the groove type contact holes 210, 210a, and 210b, and on the surface of the diffused layers 206 and 208, there is formed an N⁺-type diffused layer 211a which forms a second diffused layer with junction depth of about X (=0.15 μm). This diffused layer 211a is connected to the diffused layers 206 and 208. The depletion layer of the second diffused layer 211a to which is applied a power supply voltage is increased by about 0.25 μm. By setting the width of the groove type element isolation region as described in the above there will be caused no problem even if the depletion layer extends to below the bottom face of the groove type element isolation region 203. However, the formation of the diffused layer 211a beneath the bottom face of the groove type element isolation region 203 has to be avoided. To meet this requirement it is necessary to set $H_1 > h_{11} + X$.

In the groove type contact holes 210, 210a, and 210b there is buried a conductor film 213. The conductive film 213 is formed of an N⁺-type polycrystalline silicon film or a film of high melting point metal such as tungsten. Further, each of the groove type contact holes 210, 210a, and 210b is connected to a metallic wiring 214 consisting of an aluminum alloy film via the conductor film 213. In order to realize a contact area between the conductor film and the second diffused layer that is comparable to that in the conventional groove type contact hole one only needs to set $h_{11} = 0.7$ μm and $H_1 = 01.$μm or so. In that case, there will be obtained $h_{21} = 0.4$–$0.5$ μm.

In this embodiment, there is no need for providing a space between the groove type contact hole and the groove type element isolation region because of the structure as described in the above. Here, the spaces ($D_{12}$ and $D_{22}$) between the center line of the gate electrode 205a and the center line of the gate electrode 205b will be 2.1 μm and 1.6 μm, and the contact area will be reduced to about 78% of the value for the conventional device (one with the groove type element isolation region). Because of this, the junction capacitance due to the first diffused layer can be made smaller in comparison to that due to the prior art. In addition, the contact resistance will be comparable to that for the conventional structure, and the junction capacitance due to the second diffused layer will also be comparable to the conventional value.

Referring also to FIGS. 4A to 4D which are schematic sectional views, for the part shown by the line 2—2 in FIG. 3A, arranged in the order of processes, in the semi-conductor device of this embodiment, first, a LOCOS type field oxide film 202 with thickness of about 0.3 μm is formed on the surface of the P-type silicon substrate 201 with impurity concentration of (2 to 3)×10$^{17}$ cm$^{-3}$. Next, a groove with height H$_1$, maximum width W$_1$, and minimum width W$_2$ is formed by anisotropically etching the silicon substrate 201 which is in the periphery of the element formation region, and the groove type element isolation region 203 is formed by embedding an insulating film in the groove. Subsequently, the gate oxide film 204 with thickness of 7 to 10 nm is formed on the surface of the silicon substrate 201 of the element formation region [FIGS. 3A, 3B, and 4A].

Next, gate electrodes 205a and 205b with thickness of about 0.3 μm and L=0.25 μm are formed. An N$^-$-type diffused layer 206 with junction depth of about 0.2 μm is formed in self-alignment with the gate electrodes 205a and 205b. Next, a spacer 207 with width of about 0.1 μm consisting of a silicon oxide film is formed on the side faces of the gate electrodes 205a and 205b. An N$^+$-type diffused layer 208 with junction depth of about 0.1 μm is formed in self-alignment with the spacers 207 [FIGS. 3A, 3B, and 4B].

Next, an interlayer insulating film 209 with thickness of about 0.5 μm is formed all over the surface. Next, groove type contact holes 210, 210a, and 210b with the above-mentioned structure and aperture of 0.4 μm square are formed by successive etching removal of the interlayer insulating film 209, the embedded insulating film of the groove type element isolation region 203, and the silicon substrate (including the diffused layers 208 and 206) by anisotropic etching with CF$_4$ that uses a photoresist film (not shown) as the mask. Next, an N$^+$-type diffused layer 211a which forms the second diffused layer is formed on the surface of the silicon substrate 201 (including a part of the diffused layers 206 and 208 which form the first diffused layer) exposed by the groove type contact holes 210, 210a, and 210b by means of the tilted rotation ion implantation method using arsenic or phosphorus [FIGS. 3A, 3B, and 4C].

Next, a conductive film consisting of an N$^+$-type polycrystalline silicon film or a tungsten film is deposited all over the surface, and by etching this conductor film a conductor film 213 is embedded only in the interior of the groove type contact holes 210, 210a, and 210b. Subsequently, a metallic wiring 214 consisting of an aluminum alloy film is formed, thereby obtaining the semiconductor device according to this embodiment [FIGS. 3A, 3B, and 4D].

Referring also to FIGS. 5A to 5D which are schematic views arranged in the order of processes, the second embodiment according to the invention can be fabricated as in the following.

Figure 5A:
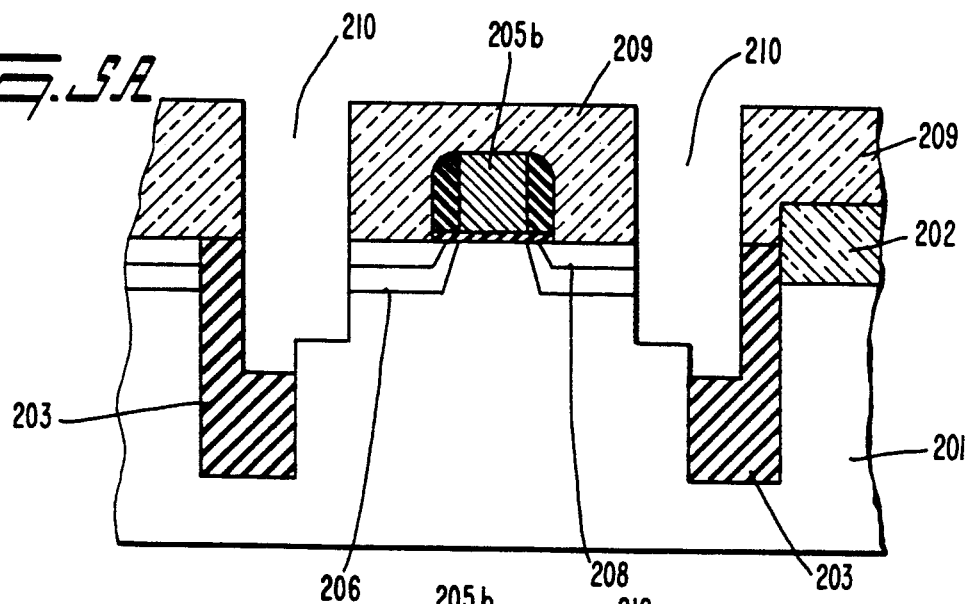
FIGS. 5A to 5D are schematic sectional views for describing a second embodiment of the invention.
Figure 5B:
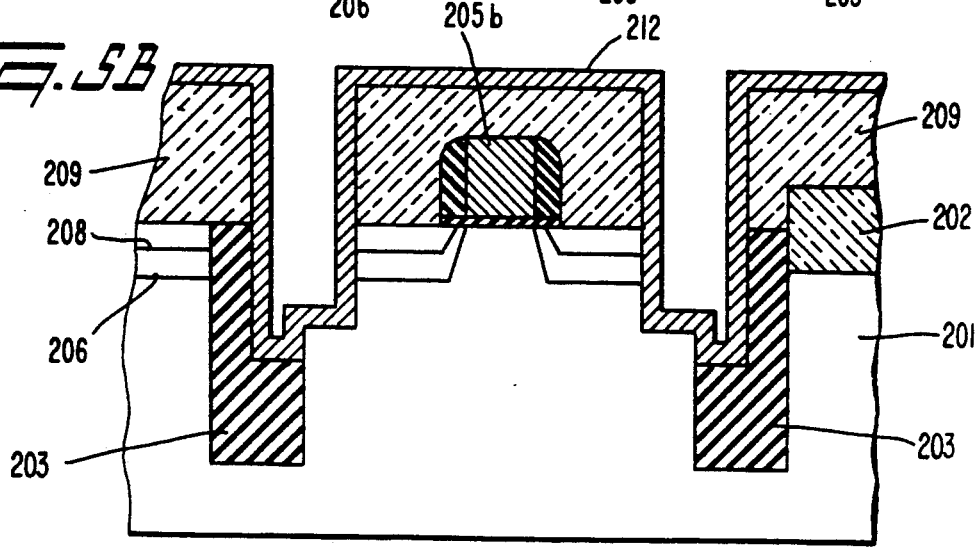
Figure 5C:
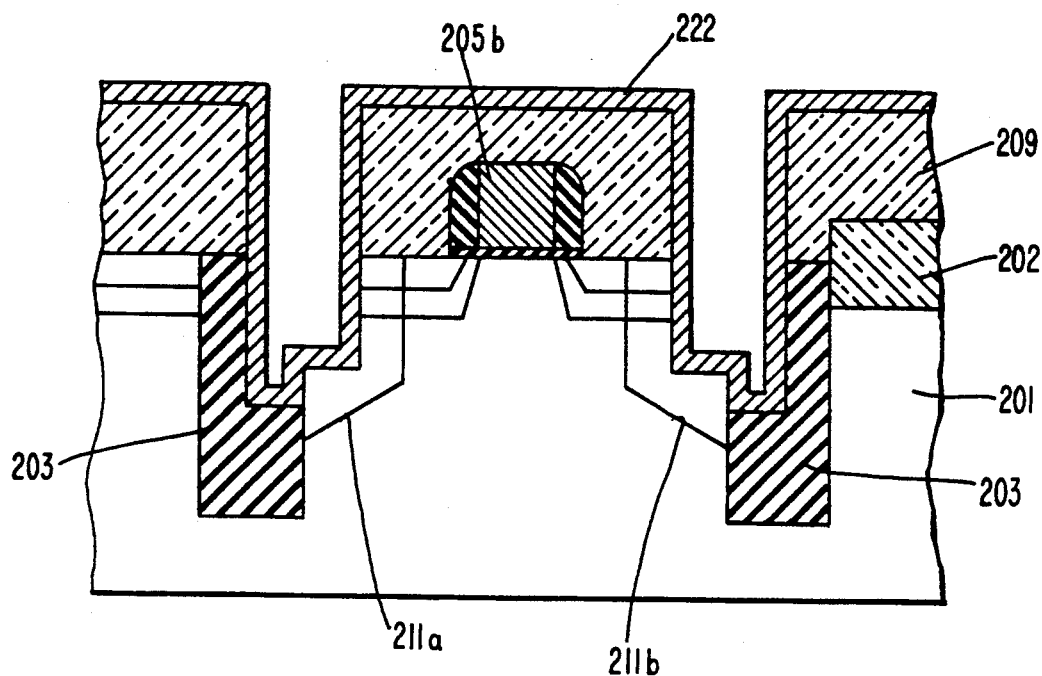
Figure 5D:
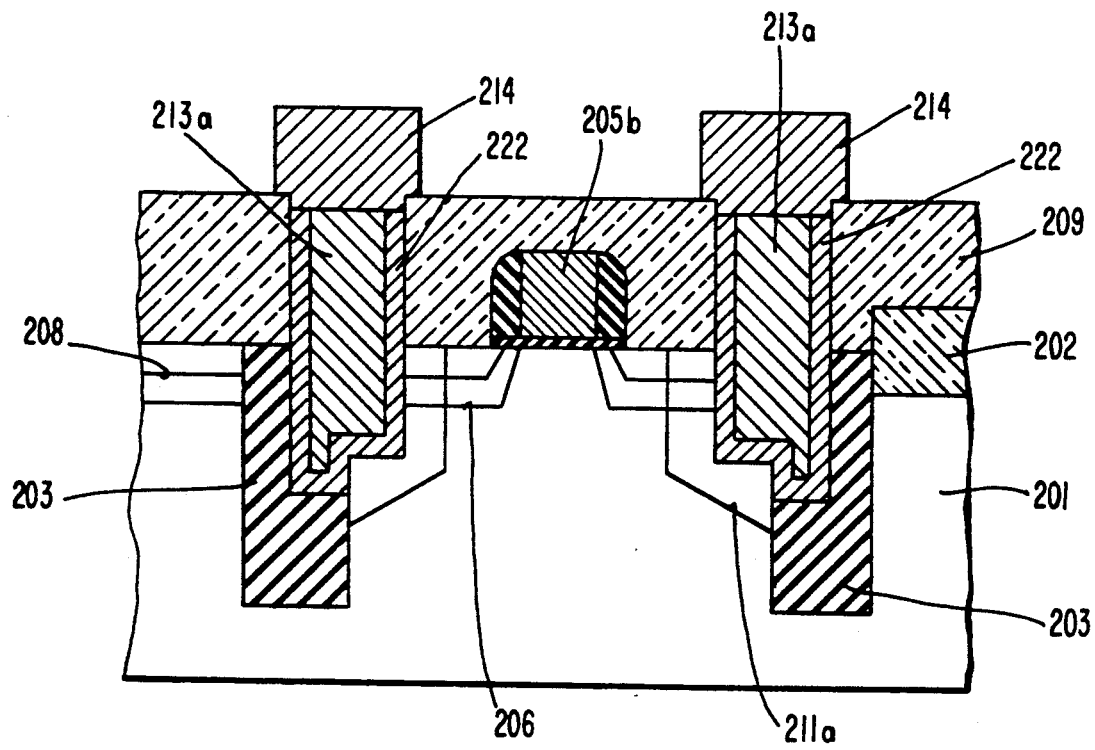

First, the processes up to the formation of the groove type contact holes 210, 210a, and 210b are the same as for the semiconductor device of the first embodiment described in the above [FIGS. 3A, 3B, and 5A]. Next, a first conductor film 212 made of an undoped polycrystalline silicon film or a high melting point metallic film having thickness of 5 to 10 nm is formed allover the surface [FIG. 5B]. Next, a conductor film 222 containing an N$^+$-type impurity is formed by ion implantation of arsenic or phosphorus. Following that, an N$^+$-type diffused layer 211b which is a second diffused layer is formed by a heat treatment in a nonoxidizing atmosphere. The junction depth of the diffused layer 211b is on the same order (X=0.15 μm) as in the first embodiment [FIG. 5C]. Next, a second conductor film 213a consisting of an N$^+$-type polycrystalline silicon film or a tungsten film is deposited allover the surface, and the conductor films 222 and 213a are embedded only in the interior of the groove type contact holes 210, 210a, and 210b by etching back the conductor films 213a and 222. Subsequently, a metallic wiring 214 consisting of an aluminum alloy is formed, obtaining the semiconductor device according to this embodiment [FIG. 5D].

This embodiment has an effect similar to that of the first embodiment, and the second diffused layer can be formed with higher accuracy than for the first embodiment. The second diffused layer in the first embodiment was formed by the tilt rotary ion implantation method. In contrast, in this embodiment, first the conductor film 222 is formed by converting the first conductor film 212 with a large diffusion coefficient to N$^+$-type, then forming the second diffused layer 211b from the N$^+$ impurity contained in the conductor film 222.

Figure 6A:
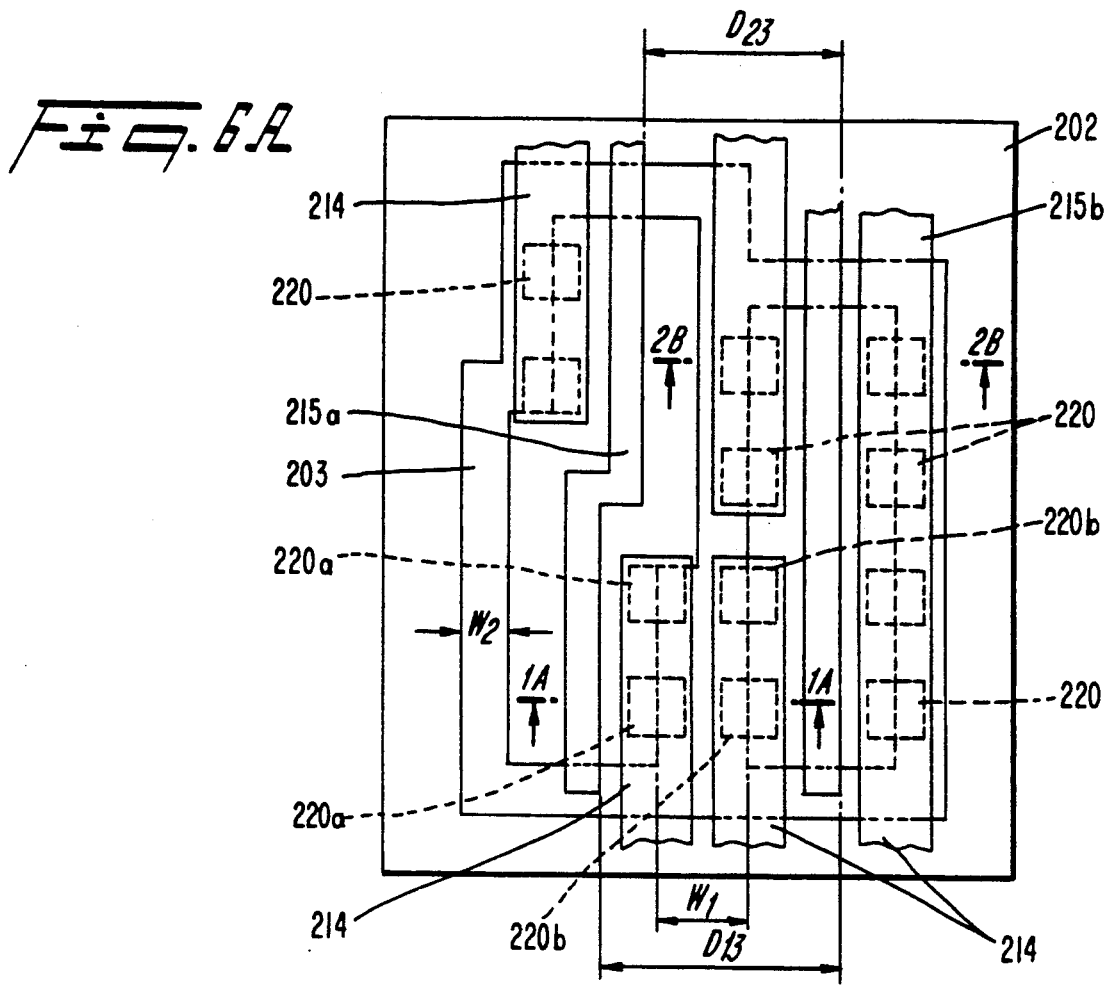
FIG. 6A is a schematic plan view for describing a third embodiment of the invention.
Figure 6B:
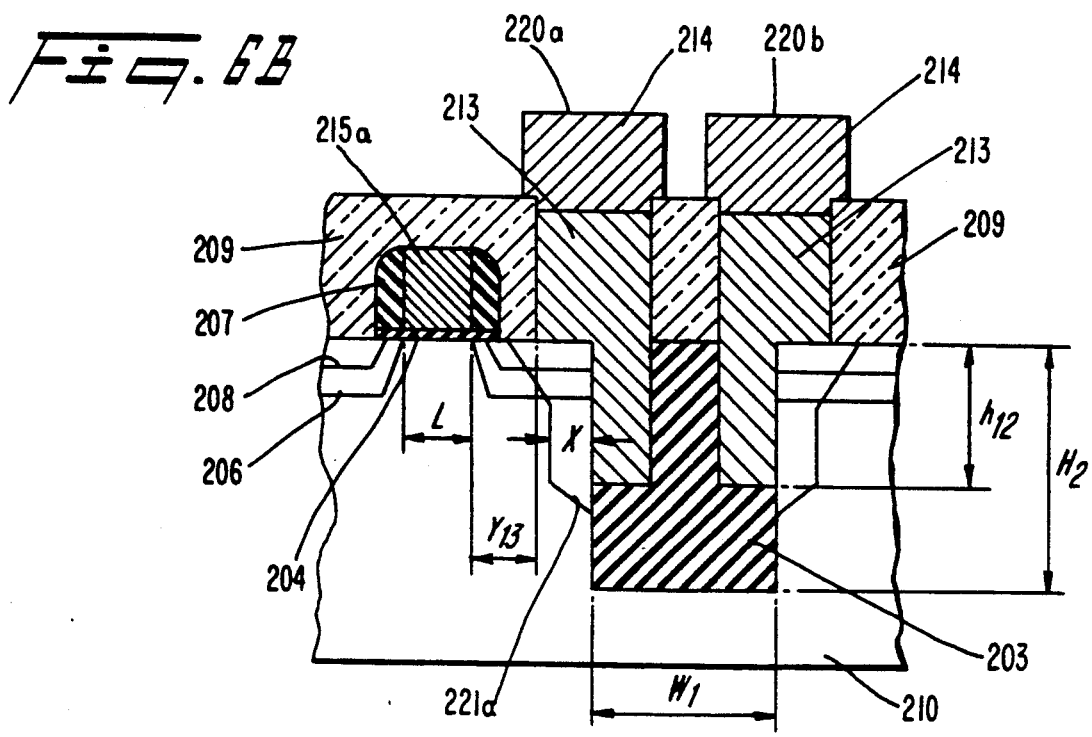
FIG. 6B is a schematic sectional view of the device in FIG. 6A along the line 1—1.

Referring to FIG. 6A which is a schematic plan view of a semiconductor device and FIG. 6B which is a schematic sectional view of the device along the line 1—1 in FIG. 6A, in the third embodiment of the invention, an element isolation region consisting of a groove type element isolation region 203 in which are embedded a LOCOS type field oxide film 202 with thickness of about 0.3 μm and an insulating film is provided on the surface of a P-type silicon substrate 201 with impurity concentration of (2 to 3)×10$^{17}$ cm$^{-3}$. In an element formation region on the surface of the silicon substrate 201 surrounded by the groove type element isolation region 203, there are formed two N-channel MOS transistors consisting of a gate oxide film 204 with thickness of about 7 to 10 nm, gate electrodes 215a and 215b with thickness of about 0.3 μm and gate length of L (=0.25 μm), an N$^-$-type diffused layer 206 formed in self-alignment with the gate electrodes and having junction depth of about 0.2 μm, a spacer 207 consisting of a silicon oxide film with width of about 0.1 μm formed on the side faces of the gate electrodes, and an N$^+$-type diffused layer 208 with junction depth of about 0.1 μm formed in self-alignment with the spacer 207. In this embodiment, a first diffused layer is constituted of the N$^-$-type diffused layer 206 and the N$^+$-type diffused layer 208. On the element isolation region and on the element formation region there is provided an interlayer insulating film 209 with thickness of about 0.5 μm (the height from the top face of the N$^+$-type diffused layer 208 to the top face of this insulating film) having a flattened surface. The interlayer insulating film 209 is constituted of a silicon oxide film or a BPSG film or a two-layer film consisting of the upper layer of a BPSG film and the lower layer of a silicon oxide film. The height (or the depth of the groove type element isolation region 203) of the top face of the silicon substrate 201 (or the top face of the N$^+$-type diffused layer 208) from the bottom face of the groove type element isolation region 203 is H$_2$, and the insulating film embedded in the groove type element isolation region 203 consists of a silicon oxide film, a BPSG film, or a two-layer film formed by the upper layer of a BPSG film and the lower layer of a silicon oxide film. The gate electrodes 215a and 215b consist of a polycrystalline silicon film or a polycide film.

Groove type contact holes 220 and 220a are formed at positions with a distance Y$_{13}$ from the gate electrode 215a, and groove type contact holes 220 and 220b are formed at positions with a distance Y$_{13}$ from the gate electrode 215b, where $Y_{13}=0.2$ μm. The apertures of the groove type contact holes 220, 220a, and 220b are 0.4 μm square each. These groove type contact holes 220, 220a, and 220b are formed at positions that straddle the boundary between the element formation region and the groove type element isolation region 203. Each bottom face of these groove type contact holes 220, 220a, and 220b consists of two parts. One part of the bottom face of each of the groove type contact holes 220, 220a, and 220b is provided within the groove type element isolation region 203, the insulating film embedded in the groove type element isolation region 203 is exposed to this part of the bottom face, and the height (or the depth of this part of the bottom face from the top face of the silicon substrate 201) from this part of the bottom face to the top face of the silicon substrate 201 (or the top face of the N+-type diffused layer 208) is equal to $h_{12}$. Note here that it is set to satisfy $h_{12}>0.2$ μm (=the junction depth of the N−-type diffused layer 206). The other part of the bottom face of each of the groove type contact holes 220, 220a, and 220b consists of the top face of the diffused layer 208.

In the part where the respective groove type contact holes 220a and 220b for the two N-channel MOS transistors come close with each other, the width of the groove type element isolation region 203 is equal to $W_1$ (=0.65 μm). At this time, the space between the groove type contact hole 220a and the groove type contact hole 220b is equal to 0.25 μm. On the other hand, in the part where the groove type contact hole is absent and where the groove type contact holes 220 are present, the width of the groove type element isolation region 203 is equal to the minimum width $W_2$ (=0.35 μm). In this case, the space between the groove type contact hole 220 and the N+-type diffused layer 208 of the adjacent transistor (this part is constituted of the groove type element isolation region 203) is equal to 0.15 μm.

An N+-type diffused layer 221a which forms a second diffused layer having junction depth of about X (=0.15 μm) is formed on the surface, of the silicon substrate 201 exposed to the bottom face and the side face of each of the groove type contact holes 220, 220a, and 220b, of the diffused layer 206, and of the diffused layer 208. This diffused layer 221a is connected to the diffused layers 206 and 208. The depletion of the second diffused layer to which is applied a power supply voltage is increased by about 0.25 μm. By setting the width of the groove type element isolation region 203 as in the above, there will be caused no difficulty even if the depletion layer extends to below the bottom face of the groove type element isolation region 203. However, the formation of the diffused layer 221a beneath the bottom face of the groove type element isolation region 203 has to be avoided. To meet this requirement it is necessary to set $H_2>h_{12}+X$.

In the groove type contact holes 220, 220a, and 220b there is embedded a conductor film 213. The conductor film 213 consists of an N+-type polycrystalline silicon film or a film of high melting point metal such as tungsten. Further, each of the groove type contact holes 220, 220a, and 220b is connected via the conductor film 213 to a metallic wiring consisting of an aluminum alloy. In order to have a contact area comparable to that between the conductor film and the second diffused layer in the conventional groove type contact hole one only needs to set $h_{12}=1.2$ μm and $H_2=1.5$ μm.

Similar to the first embodiment there is no need in this embodiment to provide a space between the groove type contact hole and the groove type element isolation region. Here, the spaces ($D_{13}$ and $D_{23}$) between the center line of the gate electrode 215a and the center line of the gate electrode 215b are 1.7 μm and 1.4 μm, and the contact area is reduced to about 65% of the conventional value (for a device with a groove type element isolation region). That is, the area of the first diffused layer is reduced compared with that of the first embodiment, which will contribute further to the enhancement of the integration and the operating speed.

Figure 7A:
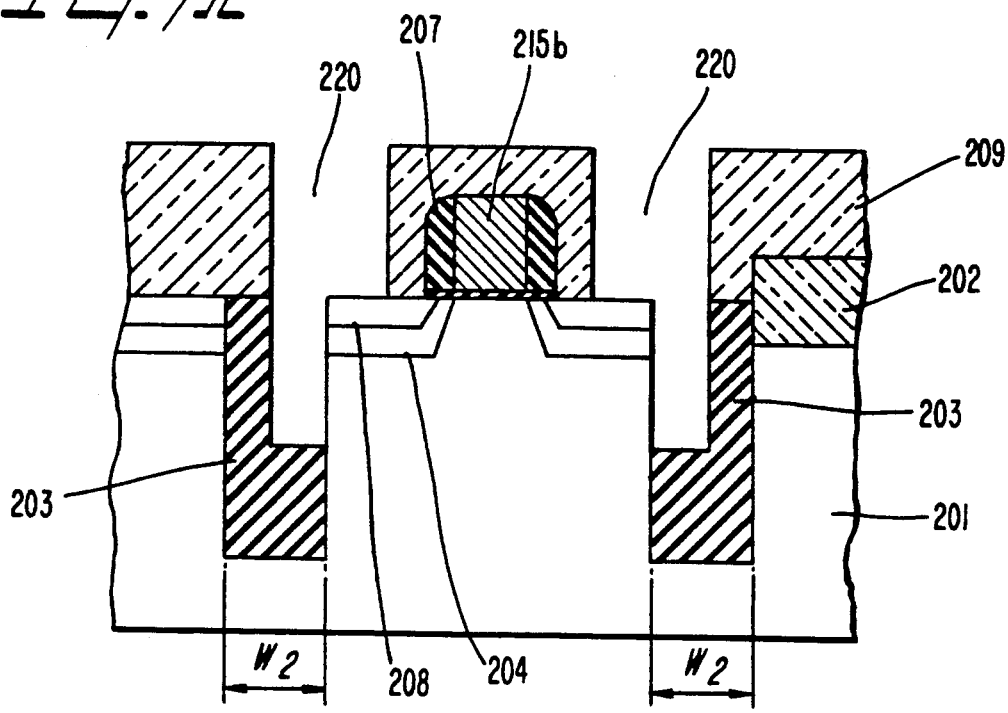
FIGS. 7A and 7B are schematic sectional views arranged in the order of processes for describing the fabrication method of the third embodiment, for the part shown by the line 2—2 in FIG. 6A.
Figure 7B:
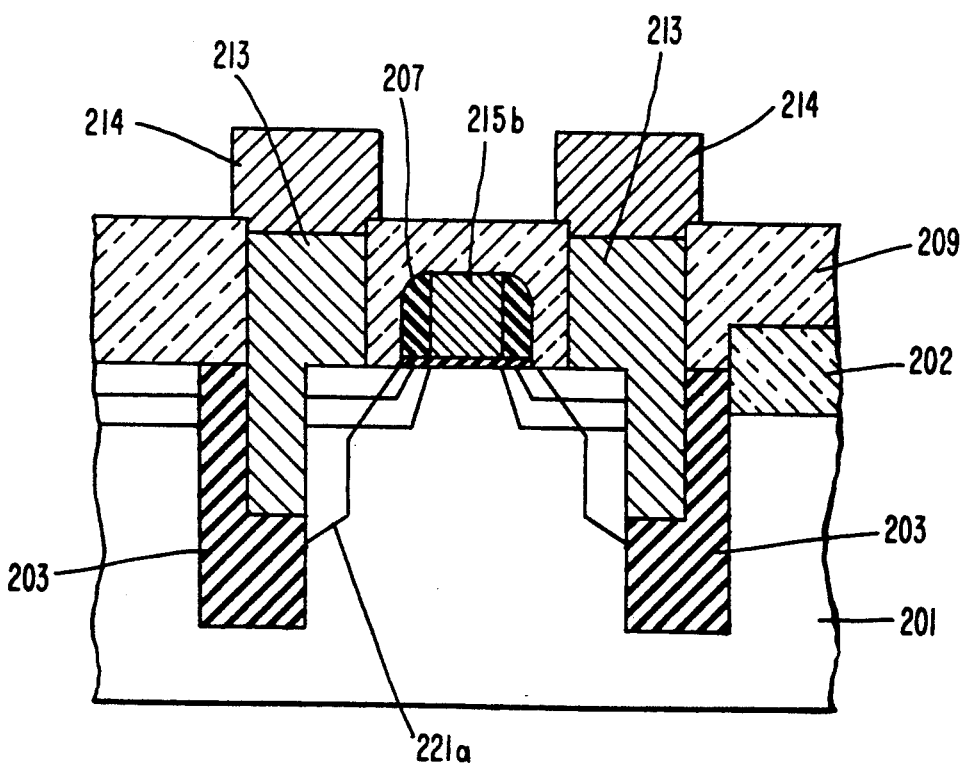

Referring to FIGS. 7A and 7B which are schematic sectional views arranged in the order of processes for the part of the line 2—2 in FIG. 6A, in the semiconductor device of the embodiment, first, a LOCOS type field oxide film 202 with thickness of about 0.3 μm is formed on the surface of a P-type silicon substrate 201 with impurity concentration of $(2$ to $3)\times 10^{17}$ cm$^{-3}$. Next, a groove with height $H_2$, maximum width $W_1$, and minimum width $W_2$ is formed by anisotropic etching of the silicon substrate 201 in the periphery of the element formation region, an insulating film is embedded in the groove, and the groove type element isolation region 203 is formed. Following that, the gate oxide film 204 with thickness of about 7 to 10 μm is formed on the surface of the silicon substrate 201 of the element formation region. Next, gate electrodes 215a and 215b with thickness of about 0.3 μm and gate length L=0.25 μm are formed. An N−-type diffused layer 206 with junction depth of about 0.2 μm is formed in self-alignment with the gate electrodes 215a and 215b. Next, a spacer 207 with width of about 0.1 μm consisting of a silicon oxide film is formed on the side faces of the gate electrodes 215a and 215b. An N+-type diffused layer 208 with junction depth of about 0.1 μm is formed in self-alignment with the spacers 207. Next, an interlayer insulating film 209 with thickness of about 0.5 μm is formed all over the surface. Next, groove type contact holes 220, 220a, and 220b with the above-mentioned structure and aperture of 0.4 μm square are formed by successively removing the interlayer insulating film 209 and the embedded insulating film of the groove type element isolation region 203 (at this time, etching of the silicon substrate 201 is slight) by means of anisotropic etching by the mixture of $CF_4$ and $O_2$ or $CHF_3$ using a photoresist film (not shown) as the mask [FIGS. 6A, 6B, and 7A].

Next, an N+-type diffused layer 221a which forms a second diffused layer is formed on the surface of the silicon substrate 201 (including a part of the diffused layers 206 and 208 which form a first diffused layer) by the tilted rotation ion implantation method of arsenic or phosphorus. Next, a conductor film consisting of an N+-type polycrystalline silicon film or a tungsten film is deposited allover the surface, and a conductor film 213 is embedded only in the interior of the groove type contact holes 220, 220a, and 220b by etching back the conductor film. Subsequently, a metallic wiring 214 consisting of an aluminum alloy film is formed, obtaining the semiconductor device according to this embodiment [FIGS. 6A, 6B, and 7B].

Figure 8A:
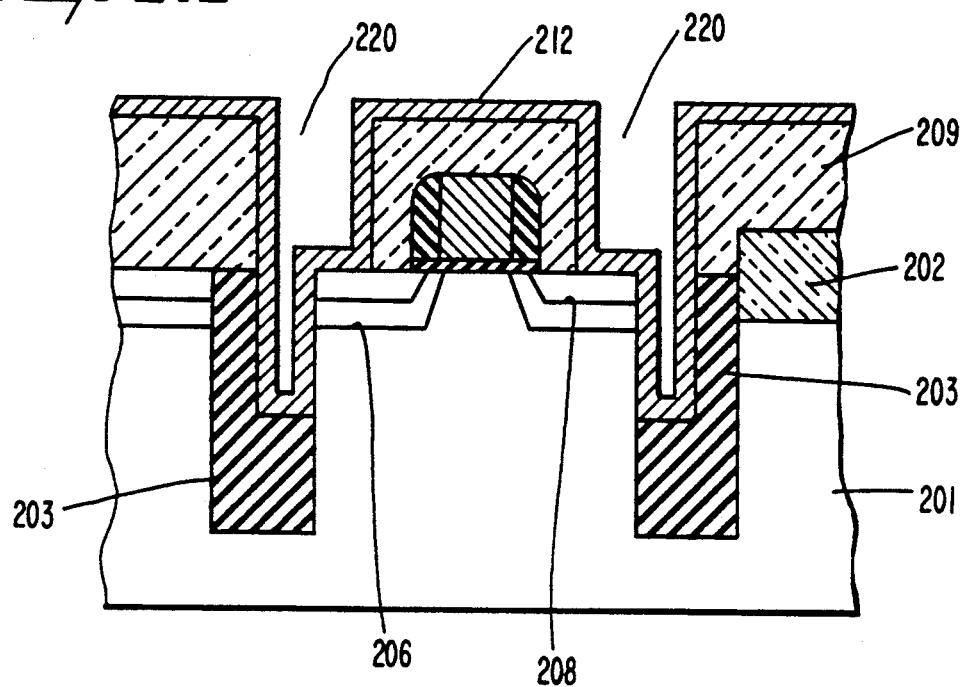
FIGS. 8A and 8B are schematic plan views for describing a fourth embodiment of the invention.
Figure 8B:
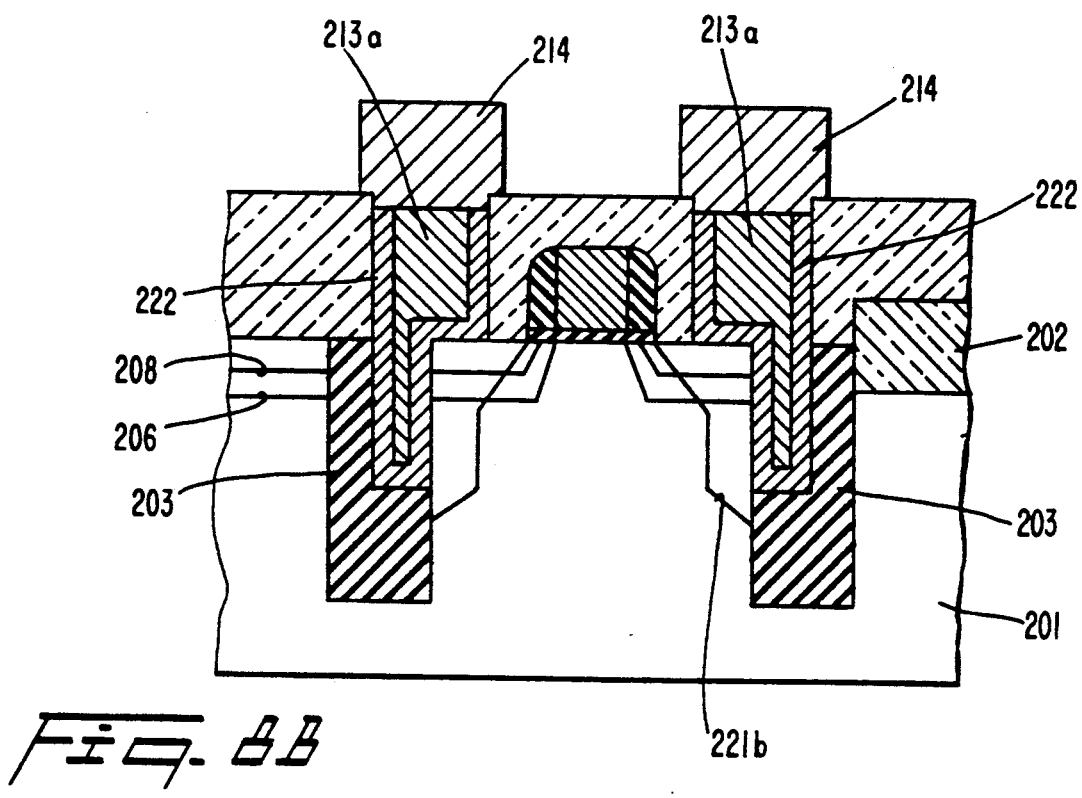

Referring also to FIGS. 8A and 8B which are schematic sectional views arranged in the order of processes, the semiconductor device according to the fourth embodiment of the invention is fabricated as in the following.

First, up to the formation of the groove type contact holes 220, 220a, and 220b processes are carried out in the same way as for the semiconductor device according to the third embodiment [FIGS. 6A, 6B, and 7A]. Next, a first conductor film 212 with thickness of 5 to 10 nm consisting of an undoped polycrystalline silicon film or a film of high melting point metal is deposited all over the surface [FIG. 8A]. Next, a conductor film 222 containing an N+-type impurity is formed by ion implantation of arsenic or phosphorus. Subsequently, an N+-type diffused layer 221b is formed by a heat treatment in a nonoxidizing atmosphere. The junction depth of the diffused layer 221b is comparable (X=0.15 μm) to that of the third embodiment. Next, a second conductor film 213a consisting of an N+-type polycrystalline silicon film or a tungsten film is deposited all over the surface, and the conductor film 222 and the conductor film 213a are embedded only in the interior of the groove type contact holes 220, 220a, and 220b by etching back the conductor films 213a and 222. Subsequently, a metallic wiring 214 consisting of an aluminum alloy film is formed, thereby obtaining the semiconductor device according to this embodiment [FIG. 8B].

This embodiment has an effect similar to that of the third embodiment, and the second diffused layer can be formed with an accuracy higher than that of the third embodiment.

Further, the first, second, third, and fourth embodiments have been described with an N-channel MOS transistor as an example, but the present invention is also applicable to a P-channel MOS transistor or a CMOS transistor or a Bi-CMOS transistor. Moreover, the invention is applicable to diffused layers used as resistor elements or diffused layers used as wirings as well.

Although the invention has been described with reference to specific embodiments, this description is not to be construed in a limiting sense. Various modifications of the disclosed embodiments as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor device, comprising:
   a semiconductor substrate of a first conductivity type,
   first and second circuit elements selectively formed in said semiconductor substrate,
   a first groove selectively formed in said semiconductor substrate between said first and second circuit elements to separate said first and second circuit elements, said first groove having a first depth,
   an insulating layer filling said first groove,
   a second groove selectively formed in said insulating layer with a second depth smaller than said first depth to remove a part of said insulating layer, said second groove exposing a portion of said semiconductor substrate by a sidewall of said second groove,
   a semiconductor region of a second conductivity type elongated from said first circuit element and formed in said portion of said semiconductor substrate, and
   a conductive layer filling said second groove, said conductive layer being in contact with said semiconductor region and separated from said semiconductor substrate by said semiconductor region and said insulating layer.

2. The semiconductor device as claimed in claim 1, wherein said conductive layer is made of a conductive material selected from doped polycrystalline silicon and a refractory metal.

3. The semiconductor device as claimed in claim 1, wherein said second groove is formed to further remove a part of said semiconductor substrate.

4. The semiconductor device as claimed in claim 1, further comprising a third groove selectively formed in said insulating layer with a third depth smaller than said first depth to remove another part of said insulating layer, said third groove exposing another portion of said semiconductor substrate by a sidewall of said third groove, an additional semiconductor region of said second conductivity type elongated from said second circuit element and formed in said another portion of said semiconductor substrate, and an additional conductive layer filling said third groove in contact with said additional semiconductor region and separately from said semiconductor substrate by said additional semiconductor region and said insulating layer.

5. The semiconductor device as claimed in claim 4, wherein said additional conductive layer is made of a conductive material selected from doped polycrystalline silicon and a refractory metal.

6. The semiconductor device as claimed in claim 4, wherein said third groove is formed to further remove another part of said semiconductor substrate.

* * * * *